(12) United States Patent
Kwark

(10) Patent No.: US 6,994,570 B2
(45) Date of Patent: Feb. 7, 2006

(54) HIGH PERFORMANCE INTERPOSER FOR A CHIP PACKAGE USING DEFORMABLE BUTTON CONTACTS

(75) Inventor: Young Hoon Kwark, Chappaqua, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/765,042

(22) Filed: Jan. 28, 2004

(65) Prior Publication Data

US 2005/0164526 A1    Jul. 28, 2005

(51) Int. Cl.
*H01R 4/58*    (2006.01)

(52) U.S. Cl. .............................. 439/91; 439/66; 361/769

(58) Field of Classification Search ................. 439/66, 439/71, 91; 361/760, 768–769, 774, 787; 174/260, 262, 267; 200/85 R; 257/778, 257/697, 692, 688, 690

See application file for complete search history.

(56) References Cited

U.S. PATENT DOCUMENTS

| | | | |
|---|---|---|---|
| 6,280,207 B1 * | 8/2001 | Sakata et al. .................. 439/91 |
| 6,497,582 B1 * | 12/2002 | Hoffmeyer .................... 439/71 |
| 6,697,261 B2 * | 2/2004 | Matsuda ...................... 361/767 |
| 6,730,860 B2 * | 5/2004 | Searls et al. ................. 174/262 |
| 2001/0023782 A1 * | 9/2001 | Nakamura ................... 174/260 |
| 2004/0177997 A1 * | 9/2004 | Hata et al. ................... 174/257 |

* cited by examiner

*Primary Examiner*—Michael C. Zarroli
(74) *Attorney, Agent, or Firm*—Ann V. Dougherty, Esq.; McGinn IP Law Group, PLLC

(57) ABSTRACT

An interposer includes an array of buttons on a carrier having a proximity to each other that allows contact between two adjacent buttons to occur when at least one of the two adjacent buttons is axially compressed above a predetermined threshold. The chip package includes a chip having a first surface and a second surface, a printed circuit board having a first surface and a second surface, and an interposer having an array of buttons between the chip and the printed circuit board. The first surfaces are closer to each other than the second surfaces.

37 Claims, 8 Drawing Sheets

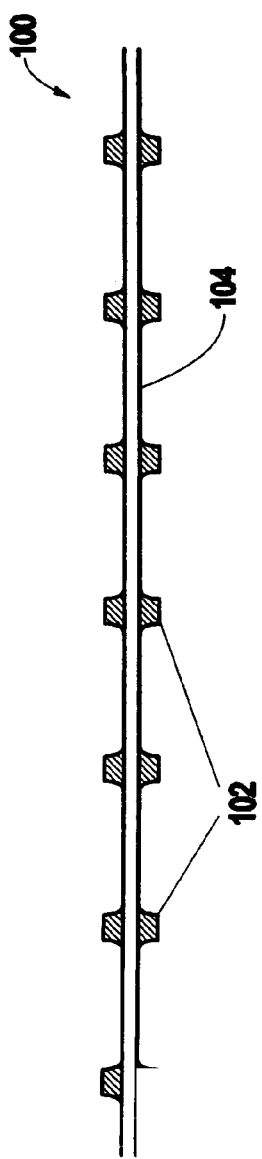
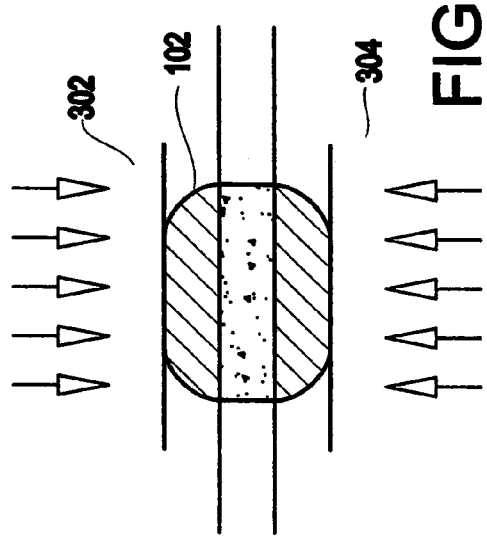
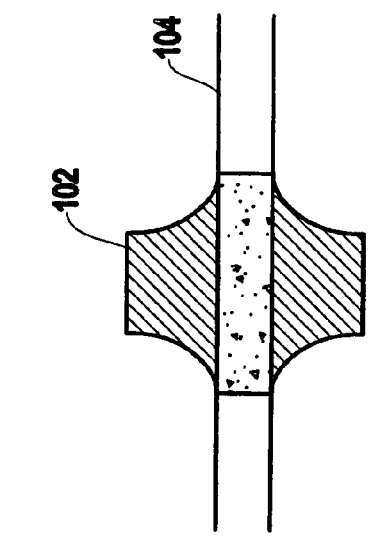
FIG. 1 PRIOR ART
FIG. 2 PRIOR ART
FIG. 3 PRIOR ART

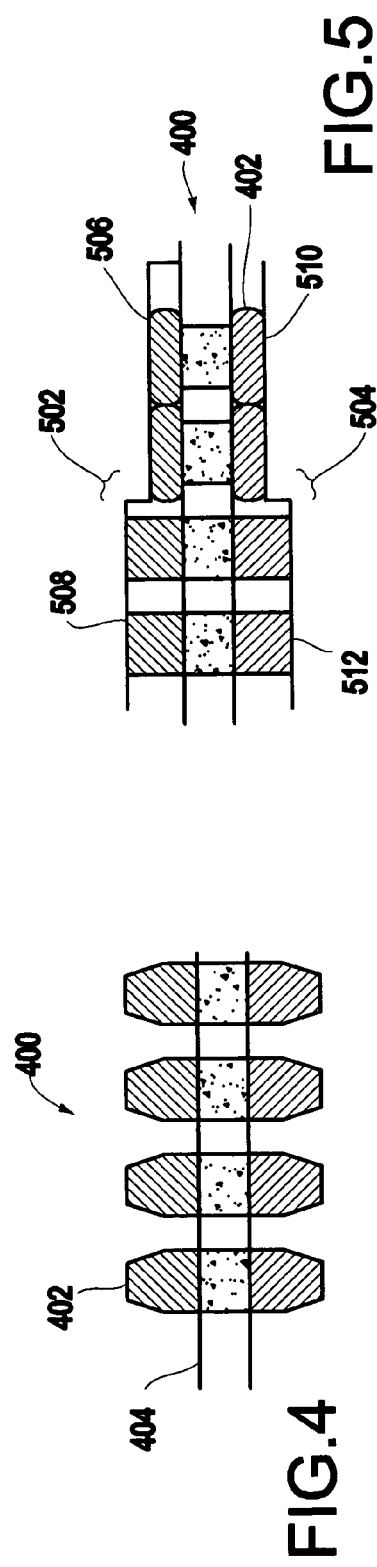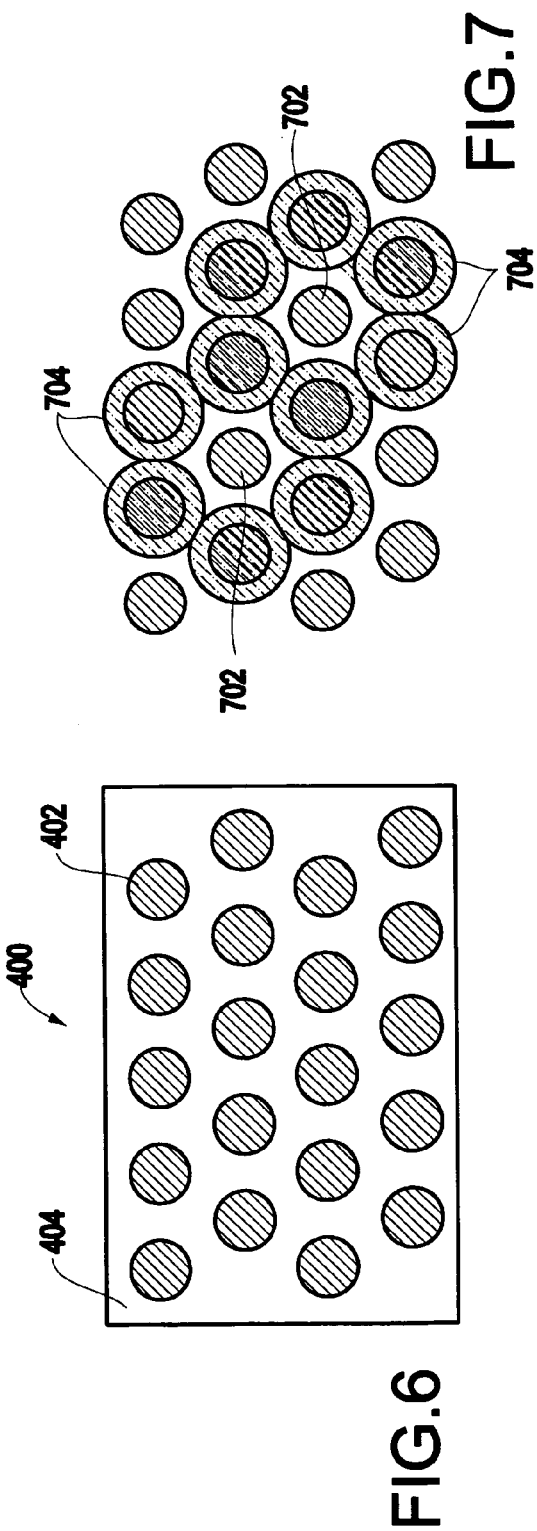

HIGH PERFORMANCE INTERPOSER FOR A CHIP PACKAGE USING DEFORMABLE BUTTON CONTACTS

BACKGROUND OF THE INVENTION

1. Field of the Invention

The present invention generally relates to an interposer for a chip package. More particularly, the present invention relates to a high performance interposer for a chip package using deformable button contacts that enables broadband high speed I/O.

2. Description of the Related Art

High pin count chip packages have evolved away from pins because of the requirement for through holes that prevent a high density from being achieved and because the pins do not permit for easy replacement of a chip in the field.

A relatively new type of technology allows one to mount a ceramic or organic chip package onto a printed circuit board (PCB) without soldering by using, for example, button contacts.

This technology uses a regular array of button contacts (hereinafter referred to as "buttons") that may be made from a compressible material, such as an elastomer or other rubber-like compound, in which are embedded a very high density of metallic particles such as, for example, silver and the like. Then, when these buttons are compressed in a chip package between a chip and a printed circuit board, the silver particles contact each other and form a very low resistance conductor.

This array of compressible buttons is typically sandwiched between a printed circuit board and a chip carrier that each have contact pads that align with and compress the buttons between them. The chip carrier maintains compression on the array of compressible buttons to establish contacts between the chip and the printed circuit board using, for example, a clamping ring around the perimeter of the package.

Typically, the compressible buttons are formed, for example, on a sheet or membrane.

FIG. 1 shows a cross-sectional view of a conventional interposer 100 having compressible buttons 102 formed on a thin carrier membrane 104. FIG. 2 shows a magnified view of one of the compressible buttons 102 on the membrane 104. FIG. 3 illustrates one of the compressible buttons 102 being compressed between a chip carrier 302 and a printed circuit board 304.

Since the compressible buttons may be relatively pliable, any mismatch between thermal coefficients of expansion between the chip carrier 302, the interposer 100 and the printed circuit board 304, that may cause a differential strain between these elements, will be readily accepted by the buttons without loss of continuity of the contacts and/or causing structural failure.

Therefore, this conventional technology provides a method and system for providing demountable chips with high I/O counts while still providing good reliability in terms of accommodating thermal expansion mismatch, and the like.

SUMMARY OF THE INVENTION

However, while this conventional technology provides the above advantages, conventional interposers are not acceptable for use with a controlled impedance transmission line over a wide frequency band. Typically, a data pattern requires transmission of information across a frequency range that may range from being direct current (DC) to a frequency that is roughly 70% of the baud rate of the signal. For example, it is desirable to have a bandwidth that spans between DC to 2 GHz for a 3 Gb/s signal. However, conventional interposers have not been acceptable for use with very high frequency signals due to the signal distortion that results.

In addition, existing designs do not provide any shielding between neighboring buttons, and cross-talk, which becomes more severe at higher frequencies will add noise to the signal which further limits the data rates that can be supported.

In view of the foregoing and other exemplary problems, drawbacks, and disadvantages of the conventional methods and structures, an exemplary feature of the present invention is to provide an interposer capable of supporting broadband signal transmission across a chip package and the chip package using an interposer that can support broadband signal transmission.

In a first exemplary aspect of the present invention, an interposer includes an array of buttons on a carrier having a proximity to each other that allows contact between two adjacent buttons to occur when two adjacent buttons are axially compressed above a predetermined threshold.

In a second exemplary aspect of the present invention, a chip package includes a chip carrier having a first surface and a second surface, a printed circuit board having a first surface and a second surface, and an interposer having an array of buttons between the chip carrier and the printed circuit board. The first surfaces being are closer to each other than the second surfaces.

In a third exemplary embodiment of the present invention a chip package includes a chip carrier, a printed circuit board, an interposer having an array of buttons between the chip carrier and the printed circuit board, and a sheet positioned between the interposer and one of the chip carrier and the printed circuit board. The sheet defines a first hole through which one of the array of buttons passes and a second hole through which another one of the array of buttons passes. The first hole compresses the one button more than the second hole compresses the another button.

In a fourth exemplary embodiment of the present invention, a chip package includes a chip carrier, a printed circuit board, an interposer having an array of buttons between the chip and the printed circuit board, and a sheet positioned between the interposer and one of the chip carrier and the printed circuit board. The sheet defines a hole through which one of the array of buttons passes and includes a conductive disc axially compressing another one of the array of buttons.

Like the conventional art, the present invention provides a method and system for providing demountable chips with high I/O counts while still providing good reliability in terms of thermal expansion mismatch, and the like.

However, in stark contrast to conventional interposers, the present invention provides an interposer that is acceptable for use with a controlled impedance transmission line over a wide frequency band. In particular, the interposer of the present invention is acceptable for use with very high frequency signals.

The controlled impedance afforded by an exemplary embodiment of the present invention may mitigate signal distortion at multi-GHz data rates and may provide a self-shielding structure to alleviate cross-talk.

In addition, an exemplary embodiment of the present invention will scale readily to accommodate further increases in button density, which may be required to accommodate ever increasing demands for chip I/O density.

These advantages may accrue without requiring development of new materials, and the use of a regular array construction means that a generic interposer part number can be manufactured in high volume to reduce cost.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIG. 1 is a cross-sectional view of a conventional interposer 100 having compressible button contacts 102;

FIG. 2 is a detailed view of one of the conventional compressible button contacts 102 of FIG. 1;

FIG. 3 is a detailed, cross-sectional view of the button 102 of FIG. 2 compressed between a chip carrier 302 and a printed circuit board 304;

FIG. 4 is a cross-sectional view of one exemplary embodiment of an interposer 400 showing a closely spaced array of buttons in accordance with the present invention;

FIG. 5 is a cross-sectional view of interposer 400 of FIG. 4 compressed between a chip carrier 502 and a printed circuit board 504;

FIG. 6 is a plan view of the interposer 400 of FIG. 4;

FIG. 7 is a plan view illustrating compressible button contacts 702 and 704 forming a coaxial structure in accordance with an exemplary embodiment of the present invention;

DETAILED DESCRIPTION OF PREFERRED EMBODIMENTS OF THE INVENTION

Figure 8:
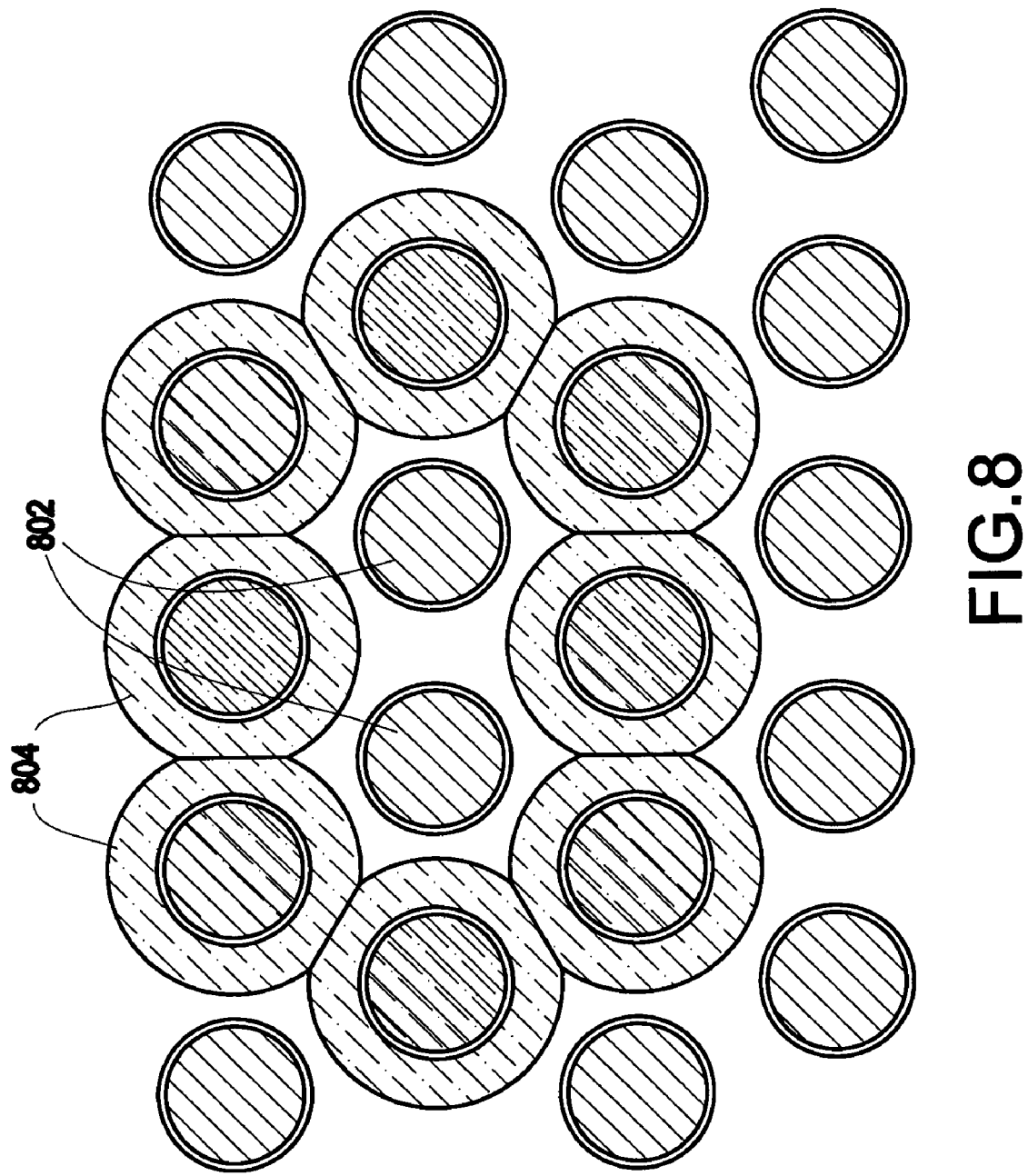
FIG. 8 is a plan view illustrating compressible button contacts 802 and 804 forming a multi-conductor coaxial transmission structure in accordance with yet another exemplary embodiment of the present invention.

Referring now to the drawings, and more particularly to FIGS. 1–13, there are shown exemplary embodiments of the method and structures of the present invention.

FIGS. 1–3 illustrate that conventional interposers have buttons 102 that are located on centers that are sufficiently separated so that, as the buttons radially expand from axial pressure being applied, the buttons 102 do not contact each other.

In stark contrast, as shown in FIG. 4, an exemplary embodiment of the present invention provides an interposer 400 that has buttons 402 spaced on a thin carrier membrane 404 close enough that when compressed above a predetermined threshold, adjacent buttons will radially expand enough to contact each other.

FIG. 5 illustrates the exemplary embodiment of the interposer 400 that is shown in FIG. 4, being subject to differential compression between a chip carrier 502 and a printed circuit board 504.

As shown in FIG. 5, the chip carrier 502 has a first surface 506 and a second surface 508 that differentially compress the buttons 402 between a corresponding first surface 510 and second surface 512 on the printed circuit board. The buttons 402 between the first surfaces 506 and 510 are axially compressed more than the buttons 402 that are compressed between corresponding second surfaces 508 and 512.

Thus, FIG. 5 clearly illustrates the differential compression of one exemplary embodiment of the present invention where adjacent buttons 402 radially expand into contact with each other when those buttons are axially compressed above a predetermined threshold. Below that predetermined threshold, the buttons 402 do not radially expand enough to provide contact with each other. However, they do provide sufficient electrical continuity through the button.

FIG. 6 illustrates an exemplary embodiment of the interposer 400 of the present invention in plan view. As is clearly illustrated in FIG. 6, the buttons 402 are substantially evenly spaced on the membrane 404. While the present invention does not require even spacing between the contacts, even spacing is advantageous to ensure that the interposer is usable with a wide variety of chip/circuit board combinations without requiring customization for each specific application. This permits a generic interposer with the appropriate pitch and button count to address a wide variety of designs with minimal cost impact.

Further, even spacing or distribution of the buttons on the membrane also ensures a substantially even distribution of stresses across the chip package.

Alternatively, in another exemplary embodiment of the present invention (not shown), the buttons may be formed on the membrane at positions, which are specific to any given application.

FIG. 7 illustrates an exemplary embodiment of the present invention where the differential compression feature of the buttons is used to form, for example, a coaxial conductor geometry that enables broad band low loss controlled impedance operation. FIG. 7 illustrates buttons 702 that have been axially compressed to a first level to provide central conductors and buttons 704 that have been axially compressed to a second level to provide a shield that surrounds the central conductors. Preferably, the second level of axial compression of the buttons 704 is higher than the first level of axial compression of the buttons 702.

More preferably, the second level of axial compression of the buttons 704 is above a predetermined threshold that allows the radial surfaces to contact each other to form continuous rings around the central conductor buttons 702 while the axial compression of the buttons 702 is less than the predetermined threshold.

For high-speed signal propagation, a coaxial conductor geometry supports a transverse electromagnetic (TEM) mode, which makes it broadband. (i.e. impedance and loss Vs frequency are relatively flat). This is increasingly important as data rates continue to increase in digital systems. For example, a 3 Gb/s signaling rate may require a bandwidth in excess of 2 GHz.

As explained above, and shown in FIG. 7, the differential compression feature of the present invention enables the creation of such a coaxial structure. The coaxial configuration afforded by this construction not only provides a broadband controlled impedance signal path, it is also self-shielding and, when used in conjunction with blind vias and stripline in the mating chip carrier and printed circuit board, can greatly reduce the cross-talk between high speed signals.

Further, by controlling the diameters and spacing of the buttons on the membrane, a designer may adjust the impedance of a contact structure in accordance with requirements of any given application. For example, in a coaxial structure, the impedance is based upon the ratio of the diameter of the inner conductor to the inner diameter of the surrounding shield. Thus, the impedance may be controlled (i.e. determined) by varying the diameters and spacing of the buttons on the membrane. This simple mechanism for control may also allow multiple different impedances to be supported within a given package configuration by varying the amount of compression on the central signal button and/or by varying the spacing to the surrounding "shield" buttons.

More elaborate conductor configurations are also possible, as illustrated by FIG. 8, which shows a coaxial conductive structure providing two central conductors 802 within a peripheral ring of conductors 804 which may be axially compressed above a predetermined threshold such that they contact each other. This configuration can readily support differential signaling which is becoming a favored configuration for extremely high data rates (e.g. 10 Gb/s and above).

Thus, an exemplary embodiment of the present invention provides a way to preserve a predetermined impedance, such as, for example 50 Ohms, across a multi-GHz frequency band Controlling the impedance from the chip through the chip package through the buttons through the printed circuit board avoids signal distortions.

Further, maintaining a controlled impedance level (such as, for example 50 Ohms) may rely upon the proximity of the buttons. Conventional spacing of the buttons provides an impedance level that is much higher than the 50–100 ohms that is typical of circuit driver impedances.

Additionally, the coaxial conductive structure shown in FIG. 8 may be used as a multi-conductor transmission line. For example, the two central buttons 802 may be used as a differential signal pair. The addition of more central conductors to this configuration will support higher order signaling modes (e.g. in general, an n-tuple mode) in order to obtain more efficient utilization of channel spectrum.

There are several methods that can be used to obtain the requisite differential clearance heights that are needed between the central conductor buttons and the surrounding "shield" buttons in accordance with the present invention.

In an exemplary embodiment, the surfaces that provide the differential compression (as shown for example in FIG. 5) may be provided using chip carriers that have layered materials (laminations). These shapes can be punched out of the individual layers (e.g. the green sheets in the case of a ceramic module or laminations in the case of an organic carrier) to create the varying levels. For example, the first surfaces 506 and 510 may be created as pedestals of material and the second surfaces 508 and 512 may be created as recesses of material.

Alternatively, these shapes may be fabricated using other standard processes such as sintering or by mechanical means such as grinding, milling, laser ablation, etc.

Similarly, homologous structures in a printed circuit board can be fabricated using similar sequences.

Figure 9:
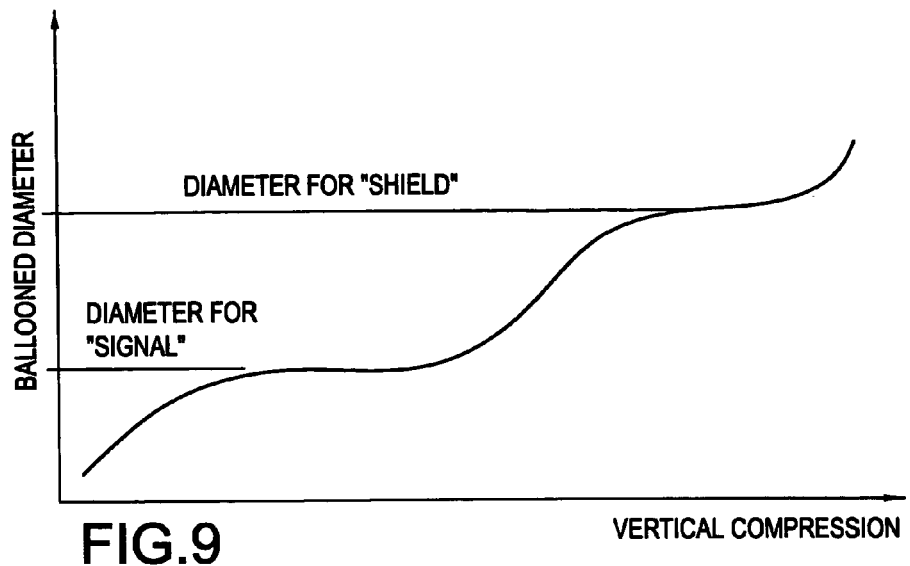
FIG. 9 is a graph illustrating an exemplary radial diameter versus vertical compression response of a compressible button contact in accordance with another exemplary embodiment of the present invention.

FIG. 9 illustrates a graph that shows the relationship between the diameter (ballooned diameter) of an exemplary button versus the axial compression (vertical compression) of the exemplary button. As is clearly evident, in this exemplary embodiment of the button, the rate of change of the diameter of the button plateaus twice along the curve. In this manner, the diameter of the button stabilizes within two ranges of axial compression so that the manufacturing and/or assembly tolerances of the chip package may be relaxed.

For example, the tolerance of vertical gap between the surfaces of the chip and the printed circuit board may be relaxed and still enable the feature of the differential compression of the buttons to be utilized.

Figure 10:
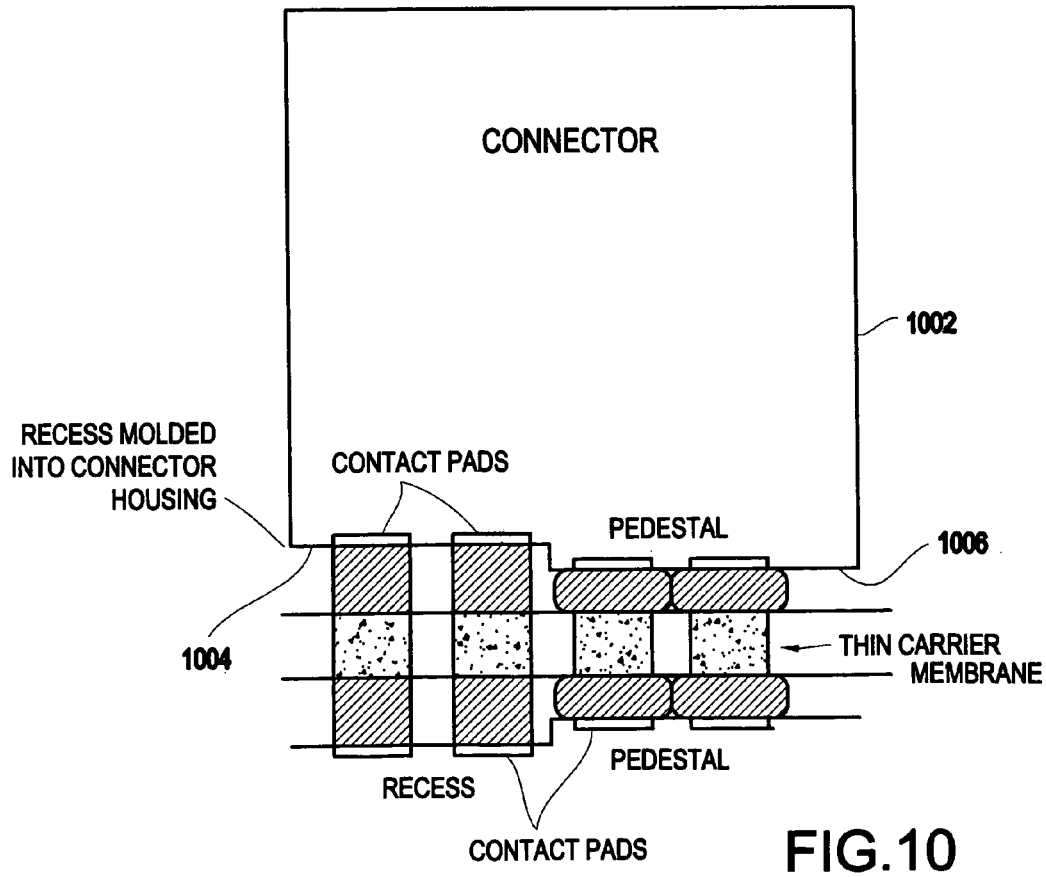
FIG. 10 illustrates another exemplary embodiment of the present invention where recesses and pedestals are molded into a connector.

While the disclosure of the present specification generally describes the use of the present invention with chip carriers mounted on PCBs, one of ordinary skill in the art appreciates that the present invention is also applicable to any planar de-mountable interface that may utilize the differential compression feature of the buttons. For example, FIG. 10 illustrates a connector 1002 mounted onto a board that utilizes this technique. Recesses 1004 and pedestals 1006 may be readily molded into a plastic connector 1002.

Figure 11A:
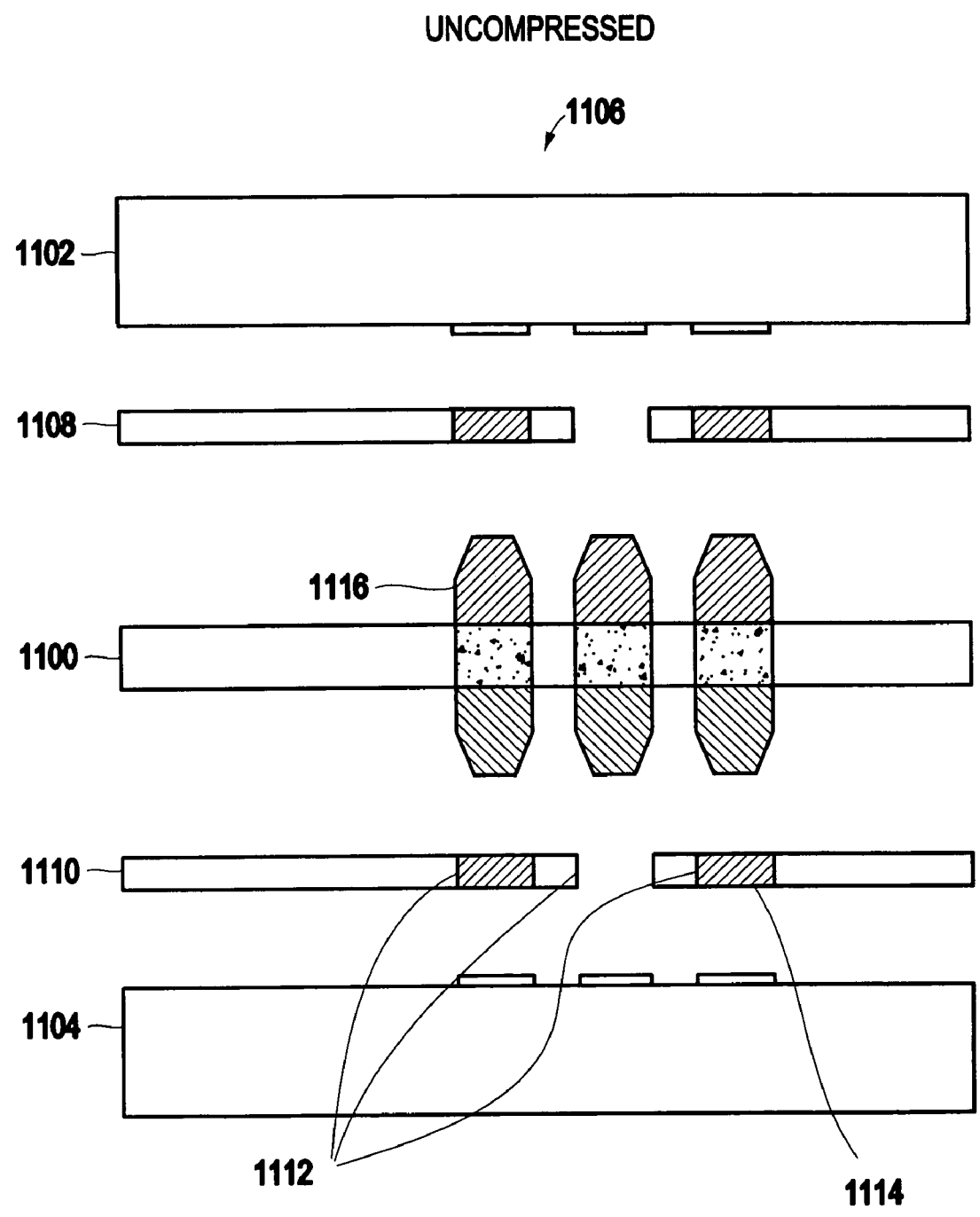
FIGS. 11A and 11B illustrate a chip package that includes a sheet that includes a conductive disc in accordance with a further exemplary embodiment of the present invention.
Figure 11B:
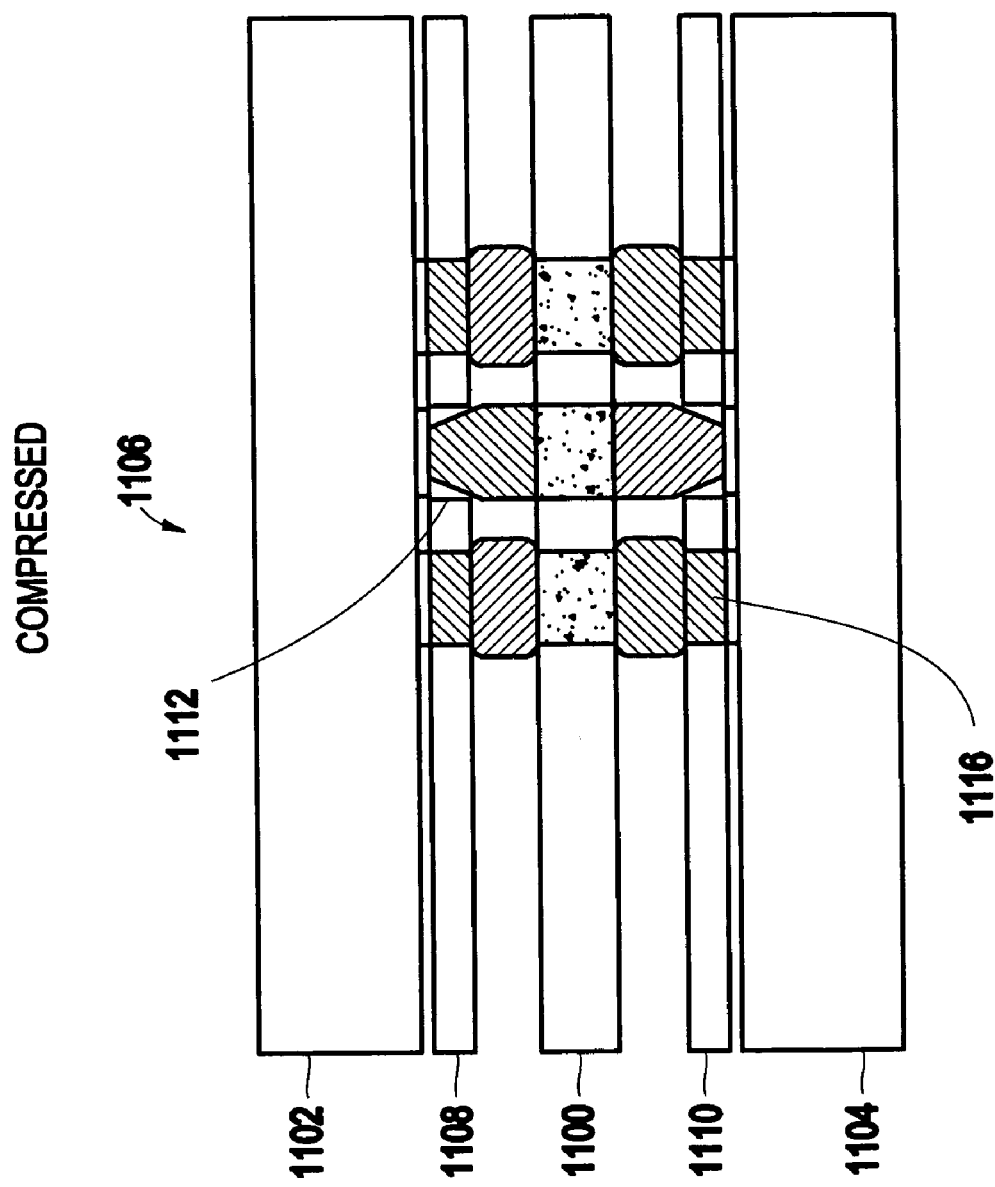

FIGS. 11A and 11B illustrate yet another exemplary embodiment of the present invention. FIG. 11A illustrates this exemplary embodiment having an interposer 1100 that in the uncompressed configuration between the chip carrier 1102 and the printed circuit board 1104, while FIG. 11B illustrates the compressed configuration.

While the interposer 1100 is similar to that described above, for example as is illustrated in FIG. 4, the chip package 1106 in FIGS. 11A and 11B include sheets 1108 and 1110, positioned between the interposer 1100 and the chip carrier 1102 and the interposer 1100 and the printed circuit board 1104, respectively. The sheets 1108 and 1110 may be formed from an insulating material and may have holes 1112 that are selectively filled with conductive discs 1114. The holes 1112 may be formed by, for example, a punching operation and the conductive discs 1114 may be formed by, for example, curing a conductive paste in selected holes.

Alternatively, all of the holes 1112 may have been filled with conductive disc 1114 and selective holes may have had the corresponding disc removed.

Either way, as is clearly illustrated by FIG. 11B, when the interposer 1110 having compressible buttons 1116 are compressed in the chip package 1106 having these sheets 1108 and 1110, those compressible buttons that are positioned between conductive discs 1114 are compressed more than those compressible buttons 1116 that extend through the holes 1112 that do not include conductive discs 1116. In this exemplary embodiment, the conductive discs 1116 provide the additional compression needed for "shield" buttons while the holes 1112 in the sheet, which have no conductive discs 1116 allow the "signal" buttons to have less compression.

Figure 12A:
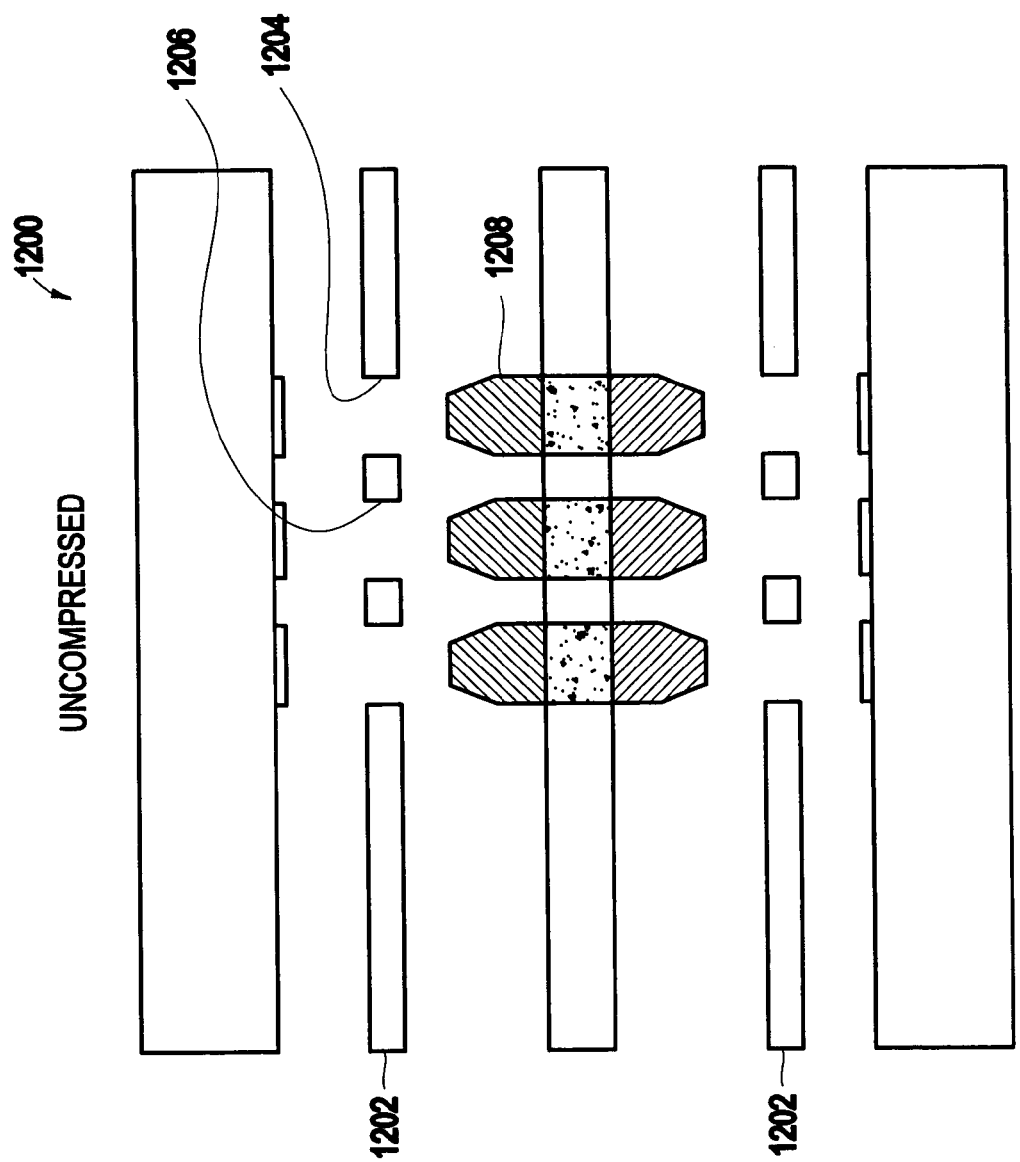
FIGS. 12A and 12B illustrate a chip package that includes a sheet having varying size holes in accordance with yet another exemplary embodiment of the present invention.
Figure 12B:
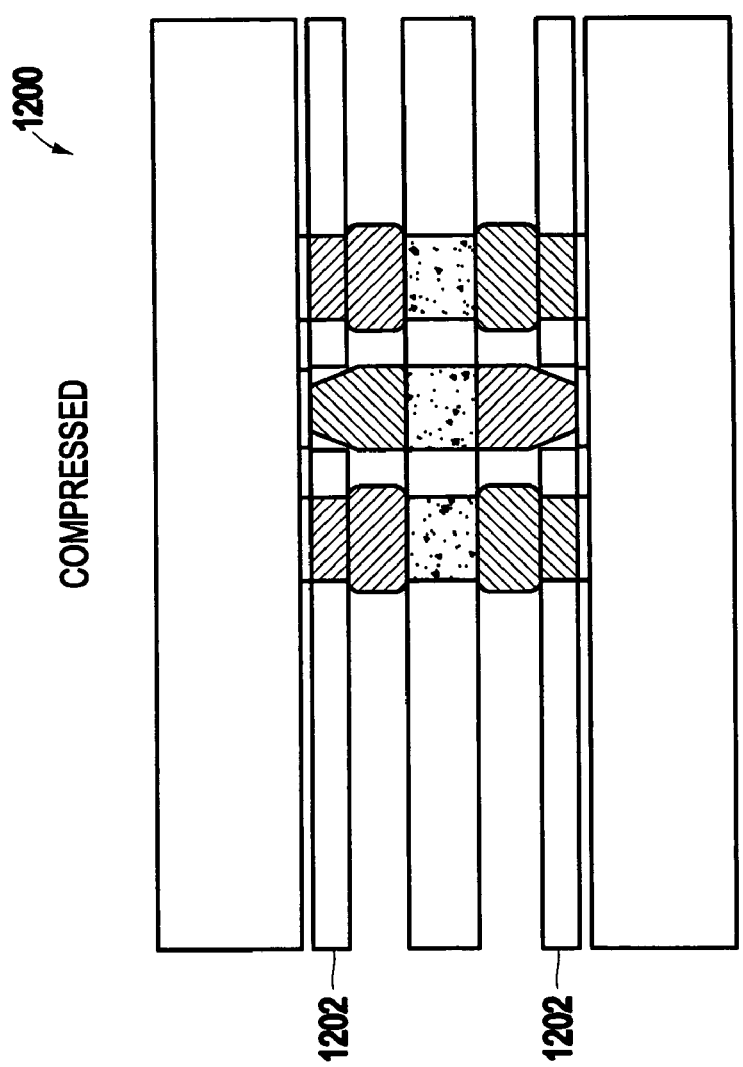

FIGS. 12A and 12B illustrate a chip package 1200 in accordance with yet another exemplary embodiment of the present invention. The chip package 1200 is the same as the chip package illustrated in FIGS. 11A and 11B described above, with the exception sheet 1202 includes holes of varying sizes and does not include any conductive discs. In this exemplary embodiment, the sheet 1202 includes a hole 1204 that is smaller than a hole 1206.

In this manner, as is illustrated by FIG. 12B, the compressible buttons 1208, which extend through the larger holes 1206 may not be compressed as much as the compressible buttons 1208, which extend through the smaller holes 1204. The smaller holes 1204 may be small enough such that the material of the compressible buttons 1208 fill the smaller holes 1204 completely such that compressible button 1208 overflows the smaller holes 1204 and causes the remainder of these compressible buttons 1208 to be compressed between the sheets 1202 such that they radially extend sufficiently to contact adjacent compressible buttons 1208.

In contrast, the compressible buttons 1208 that extend through the larger holes 1206 do not completely fill the larger hole 1206 with material. Thus, in this exemplary embodiment, even though the compressible buttons 1208 are axially compressed an identical amount, the smaller holes 1204 may cause the compressible buttons 1208 to extend radially more than the compressible buttons 1208 that extend through the larger holes 1206.

Therefore, the exemplary embodiment illustrated by FIGS. 12A and 12B is capable of providing differential compression by a different mechanism than those previously described. The smaller holes 1204 allow a smaller volume of compressible button material 1208 to fill the hole 1204, such that the remaining material of the button is then further compressed by the sheet. In contrast, the larger diameter holes 1206 do not limit the radial expansion of the compressible buttons 1208 in the larger holes 1206, hence less compression is applied to these buttons.

Figure 13:
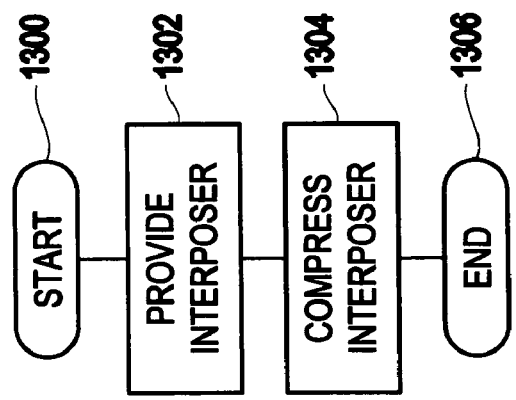
FIG. 13 illustrates an exemplary method of making a chip package in accordance with the present invention.

FIG. 13 illustrates a flowchart of an exemplary method of making a chip package in accordance with the present invention. The method starts at step 1300 and continues to step 1302. At step 1302, an interposer is provided that includes an array of buttons on a carrier having a proximity to each other that allows contact between two adjacent buttons to occur when the two adjacent buttons are compressed above a predetermined threshold. Next, at step 1304, the interposer is compressed between a chip and a printed circuit board to form a chip package. The method ends at step 1306.

The differential compression feature of an exemplary embodiment of the present invention may rely upon the buttons being shaped such that, when they are compressed at a higher level, they radially extend significantly more than they do when only lightly compressed. These two compression levels then form two different types of button contacts. The more lightly compressed buttons may form a center pin of a coaxial geometry while the more highly compressed buttons may be spaced such that the edges merge and form a continuous ring around the more lightly compressed button. Thereby providing a metallic coaxial configuration, which can support a controlled impedance TEM (transverse electric and magnetic) type of a wave. A TEM type of signal propagation is a broad band mode because it may transmit a very large range of frequencies (i.e. from a D.C. signal to a very high frequency signal) while maintaining the same impedance.

While the compressible buttons have been described above in terms of a compressible button that may be formed from an elastomer, one of ordinary skill in the art understands that an exemplary embodiment of the present invention may include buttons that are formed from any deformable, conductive material. Other deformable conductive materials include, for example, a "soft" deformable metal similar to a soft metal gasket such as indium, a solder ball, or the like. If a deformable metal is used for the buttons, however, the interposer may need to be replaced after demounting.

While the invention has been described in terms of several exemplary embodiments, those skilled in the art will recognize that the invention can be practiced with modification.

Further, it is noted that, Applicant's intent is to encompass equivalents of all claim elements, even if amended later during prosecution.

What is claimed is:

1. An interposer comprising:
an array of buttons on a carrier having a proximity to each other that allows physical contact between two adjacent buttons to occur when the two adjacent buttons are compressed above a predetermined threshold, wherein a rate at which the radius of at least one of the buttons expands while being axially compressed slows at a first range of axial compression.

2. The interposer of claim 1, wherein the array of buttons is arranged in a regularly spaced array.

3. The interposer of claim 1, wherein the array of buttons is arranged in a custom arrangement based upon positions of the contacts on one of a chip carrier and a printed circuit board.

4. The interposer of claim 1, wherein the rate at which the radius of the two buttons expand while being axially compressed slows at a second range of axial compression.

5. The interposer of claim 1, wherein the buttons comprise an elastomeric compound that has embedded metallic particles.

6. The interposer of claim 1, wherein the buttons comprise a deformable material.

7. The interposer of claim 6, wherein the buttons comprise a deformable metal.

8. The interposer of claim 7, wherein the buttons comprise soft metal balls.

9. A chip package comprising:
a chip having a first surface and a second surface;
a printed circuit board having a first surface and a second surface, wherein the first surfaces are closer to each other than the second surfaces; and
an interposer having an array of buttons between said chip and said printed circuit board, wherein said first surfaces face each other and said second surfaces face each other.

10. The package of claim 9, wherein at least one button of the array of buttons is compressed between said first surfaces.

11. The package of claim 10, wherein said at least one button contacts an adjacent button in the array of buttons.

12. The package of claim 10, wherein at least one other button of the array of buttons is compressed between said second surfaces.

13. The package of claim 12, wherein at least one button of the array of buttons comprises a plurality of buttons compressed between said first surfaces and surrounding said at least one other button of the array of buttons compressed between said second surfaces.

14. The package of claim 13, wherein the plurality of buttons compressed between said first surfaces are compressed above a predetermined threshold such that adjacent buttons of the plurality of buttons contact each other.

15. The package of claim 14, wherein the plurality of buttons compressed between said first surfaces and said at least one other button of the array of buttons compressed between said second surfaces form at least one coaxial transmission line.

16. The package of claim 15, wherein the at least one coaxial transmission line supports a transverse electro-magnetic mode of propagation across a wide frequency band.

17. The package of claim 15, wherein the at least one coaxial transmission line provides a predetermined impedance across a frequency band.

18. The package of claim 17, wherein the predetermined impedance is between about 50 Ohms and 100 Ohms.

19. The package of claim 17, wherein the wide frequency band is about 3 GHz wide.

20. The package of claim 9, wherein the array of buttons is arranged in a regularly spaced array.

21. The package of claim 9, wherein the array of buttons is arranged in a custom arrangement based upon positions of the contacts on one of the chip carrier and the printed circuit board.

22. The package of claim 9, wherein a rate at which the radius of at least one button of the buttons expands while being axially compressed slows at a first range of axial compression.

23. The package of claim 22, wherein the rate at which the radius of the at least one button expands while being axially compressed slows at a second range of axial compression.

24. The package of claim 9, wherein at least one button of the buttons comprise an elastomeric compound having embedded metallic particles.

25. The package of claim 9, wherein the buttons comprise a deformable material.

26. The package of claim 25, wherein the buttons comprise a deformable metal.

27. The package of claim 26, wherein the buttons comprise soft metal balls.

28. The package of claim 9, further comprising a clamping ring holding the chip against the interposer and the interposer against the printed circuit board.

29. The package of claim 9, wherein the chip comprises laminations that form said first surface and said second surface.

30. The package of claim 9, wherein the printed circuit board comprises laminations that form said first surface and said second surface.

31. A chip package comprising:
a chip carrier;
a printed circuit board;
an interposer having an array of buttons between said chip carrier and said printed circuit board; and
a sheet positioned between the interposer and one of the chip carrier and the printed circuit board,
wherein the sheet defines a first hole through which a first button of the array of buttons passes and a second hole through which a second button of the array of buttons passes, and
wherein the first hole compresses the first button more than the second hole compresses the second button.

32. The package of claim 31, wherein the second hole is large enough such that the second button does not contact the sheet.

33. The package of claim 31, wherein the first button is compressed such that the first button radially contacts an adjacent button.

34. A chip package comprising:
a chip carrier;
a printed circuit board;
an interposer having an array of buttons between said chip carrier and said printed circuit board; and
a sheet positioned between the interposer and one of the chip carrier and the printed circuit board,
wherein the sheet defines a hole through which a first button of the array of buttons passes and comprises a conductive disc axially compressing a second button of the array of buttons.

35. The package of claim 34, wherein the second button is axially compressed such that the second button radially contacts an adjacent button.

36. A method of making a chip package comprising:
providing an interposer having an array of buttons on a carrier having a proximity to each other that allows contact between two adjacent buttons to occur when the two adjacent buttons are axially compressed above a predetermined threshold; and
compressing the interposer between a chip carrier and a printed circuit board, wherein a rate at which the radius of at least one of the buttons expands while being compressed slows at a first range of axial compression.

37. A method of making a chip package comprising:
providing an interposer having an array of buttons;
providing a sheet having a hole and a conductive disc;
positioning the interposer between a chip carrier and a printed circuit board; and
positioning the sheet between the interposer and one of the chip carrier and the printed circuit board such that a first button of the array of buttons passes through the hole in the sheet and such that a second button of the array of buttons is axially compressed by the conductive disc.

* * * * *